United States Patent
Zhu et al.

(10) Patent No.: US 9,581,506 B1
(45) Date of Patent: Feb. 28, 2017

(54) METHODS FOR EVALUATING STRAIN OF CRYSTALLINE DEVICES

(71) Applicant: Globalfoundries Singapore Pte. Ltd., Singapore (SG)

(72) Inventors: Jie Zhu, Singapore (SG); Binghai Liu, Singapore (SG); Eddie Er, Singapore (SG); Si Ping Zhao, Singapore (SG); Jeffrey Lam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/084,834

(22) Filed: Mar. 30, 2016

(51) Int. Cl.
  *H01L 21/00* (2006.01)
  *G01L 1/25* (2006.01)
  *H01L 21/66* (2006.01)

(52) U.S. Cl.
  CPC .............. *G01L 1/25* (2013.01); *H01L 22/20* (2013.01)

(58) Field of Classification Search
  CPC .................................. G01L 1/25; H01L 22/20
  See application file for complete search history.

(56) References Cited

U.S. PATENT DOCUMENTS

2015/0243738 A1* 8/2015 Shimomura ............ H01L 29/24
  257/43
2015/0318359 A1* 11/2015 Shimomura ............ H01L 29/24
  257/43
2016/0139063 A1* 5/2016 Taheri ..................... G01N 23/04
  250/307
2016/0225620 A1* 8/2016 Yamazaki ......... H01L 21/02565

OTHER PUBLICATIONS

Baumann, Nanobeam Beam Diffraction (NBD) in the TEM for Drift-corrected Strain Mapping in Semiconductor Devices, IBM Microelectronics Division, 2 pages.
Vartuli, Strain Measurements Using Nano-Beam Diffraction on a FE-STEM, Microsc Microanal, 2007, pp. 336-837, vol. 13(Supp. 2).
Chapter 9 Image Enhancement Processing, pp. 127-132.
Batch processing downloaded from Wikipedia on Nov. 12, 2015, 4 pages.
Median filter downloaded from Wikipedia on Nov. 12, 2015, 3 pages.
Smoothing downloaded from Wikipedia on Jun. 9, 2015, 3 pages.

* cited by examiner

*Primary Examiner* — Caleb Henry
(74) *Attorney, Agent, or Firm* — Lorenz & Kopf, LLP

(57) ABSTRACT

Methods for evaluating strain of crystalline structure are provided herein. In accordance with an exemplary embodiment, a method for evaluating strain of a crystalline structure includes directing an electron beam at the crystalline structure to produce an electron diffraction pattern including a reflection point area. The electron diffraction pattern is detected with a detector that includes a plurality of pixels to produce a raw data set. The raw data set is filtered by applying a mathematical median filter to produce a filtered data set, and a contrast of the filtered data set is enhanced to produce an enhanced data set. A center point of the reflection point area is determined with the enhanced data set, and the strain of the crystalline structure is determined based on analysis of the center point.

20 Claims, 4 Drawing Sheets

METHODS FOR EVALUATING STRAIN OF CRYSTALLINE DEVICES

TECHNICAL FIELD

The technical field relates generally to crystalline structures, and more particularly to methods for evaluating strain of crystalline structures within semiconductor devices.

BACKGROUND

Semiconductor devices, such as metal oxide semiconductor field effect transistors (MOSFETs) or simply field effect transistors (FETs) or MOS transistors, are the core building block of a vast majority of electronic devices. A FET includes source and drain regions between which a current can flow through a channel under the influence of a bias applied to a gate electrode that overlies the channel. The channel typically includes crystalline material, such as monocrystalline silicon. To increase carrier mobility, strain can be introduced into the channel region of the semiconductor device. In practice, it is desirable to accurately and precisely fabricate such semiconductor devices with a predetermined strain profile to thereby achieve devices having their intended performance characteristics and/or to improve production yield. However, the hardware tools and production processes used to fabricate such devices may exhibit performance and/or process variations. As a result, semiconductor devices may be fabricated with strain profiles that deviate from their intended strain values, which in turn can lead to performance issues and/or reduced production yield. Therefore, it is desirable to evaluate strain levels of crystalline structures within semiconductor devices.

One technique for evaluating the strain profiles of crystalline structures is transmission electron microscopy (TEM) nano-beam diffraction (NBD). TEM NBD is a microscopy technique in which a beam of electrons is transmitted through a thin sample, with the electrons interacting with the sample as the electrons pass through so as to produce an electron diffraction pattern with reflections that correspond to the crystal lattice structure of the sample including the lattice spacing. The position of reflections from a strained crystal lattice structure, such as strained crystalline silicon, is shifted with respect to that from an unstrained crystal lattice structure, e.g., unstrained crystalline silicon. Therefore, strain can be calculated by measuring the change of center positions of the reflections. Unfortunately, it can be difficult to identify precise center positions of reflections due to asymmetrical intensity profiles of the reflections as a result of strong dynamical diffraction effects, which can negatively impact the accuracy of the strain measurement(s).

Accordingly, it is desirable to provide methods for evaluating strain of crystalline structures including more precisely identifying the center positions of reflections of an electron diffraction pattern. Furthermore, other desirable features and characteristics will become apparent from the subsequent detailed description and the appended claims, taken in conjunction with the accompanying drawings and this background.

BRIEF SUMMARY

Methods for evaluating strain of crystalline structures are provided herein. In accordance with an exemplary embodiment, a method for evaluating strain of a crystalline structure includes directing an electron beam at the crystalline structure to produce an electron diffraction pattern including a reflection point area. The electron diffraction pattern is detected with a detector that includes a plurality of pixels to produce a raw data set. The raw data set is filtered by applying a mathematical median filter to produce a filtered data set, and a contrast of the filtered data set is enhanced to produce an enhanced data set. A center point of the reflection point area is determined with the enhanced data set, and the strain of the crystalline structure is determined based on analysis of the center point.

In accordance with another exemplary embodiment, a method for controlling a strain of a crystalline structure within a semiconductor device manufacturing process is provided. The method includes directing an electron beam at an unstrained crystalline structure to produce an unstrained diffraction point. An electron beam is directed at the crystalline structure to produce an electron diffraction pattern that includes a reflection point area. The electron diffraction pattern is detected with a detector to produce raw data set, and the raw data set is mathematically filtered to produce a filtered data set. A contrast of the filtered data set is enhanced to produce an enhanced data set, and a center point of the reflection point area is determined using the enhanced data set. The center point is compared to the unstrained diffraction point to determine the strain of the crystalline structure, and the semiconductor device manufacturing process is adjusted such that the strain of the crystalline structure is within a strain specification.

In accordance with yet another exemplary embodiment, a method for evaluating strain of a crystalline structure is provided. The method includes directing an electron beam at the crystalline structure to produce an electron diffraction pattern including a reflection point area. The electron diffraction pattern is detected with a detector that includes a plurality of pixels to produce a raw data set, where the raw data set includes a pixel intensity for each of the plurality of pixels. The raw data set is filtered by applying a mathematical median filter to produce a filtered data set. Filtering the raw data set includes selecting a median pixel intensity for a range of pixels centered on a target pixel, and recording the median pixel intensity in the filtered data set as the pixel intensity for the target pixel. A contrast of the filtered data set is enhanced at the reflection point area to produce an enhanced data set. Enhancing the contrast includes saturating the pixel intensity for a set percentage of the plurality of pixels within a contrast area, where the contrast area is selected to include the reflection point area. A center point of the reflection point area is determined using the enhanced data set, and the center point is analyzed to determine the strain of the crystalline structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Embodiments of the present disclosure are generally directed to methods for evaluating strain of crystalline structures, especially crystalline structures within a semiconductor device. For the sake of brevity, conventional techniques related to evaluating strain of crystalline structures may not be described in detail herein. Moreover, the various tasks and process steps described herein may be incorporated into a more comprehensive procedure or process having additional steps or functionality not described in detail herein. In particular, some steps in evaluating strain of crystalline structures are well-known and so, in the interest of brevity, many conventional steps will only be mentioned briefly herein or will be omitted entirely without providing the well-known details.

As described herein, methods for evaluating strain of crystalline structures are provided. In an exemplary embodiment, a method for evaluating strain of a crystalline structure includes directing an electron beam at the crystalline structure to produce an electron diffraction pattern. The electron diffraction pattern is read to produce a raw data set that includes a plurality of spaced apart reflection point areas that correspond to a crystal lattice structure with a lattice spacing. In an exemplary embodiment, the electron diffraction pattern is image refined by applying a median filter to the raw data set of one or more of the spaced apart reflections using a predetermined median filter criteria to produce a filtered data set. The contrast of the filtered data set is then enhanced to produce an enhanced data set, and a center point of the enhanced data set is determined. The position of the center point can then be analyzed to determine the strain of the crystalline structure. The median filter process and/or the contrast enhancement process may be batch processed to speed the overall process.

Figure 1:
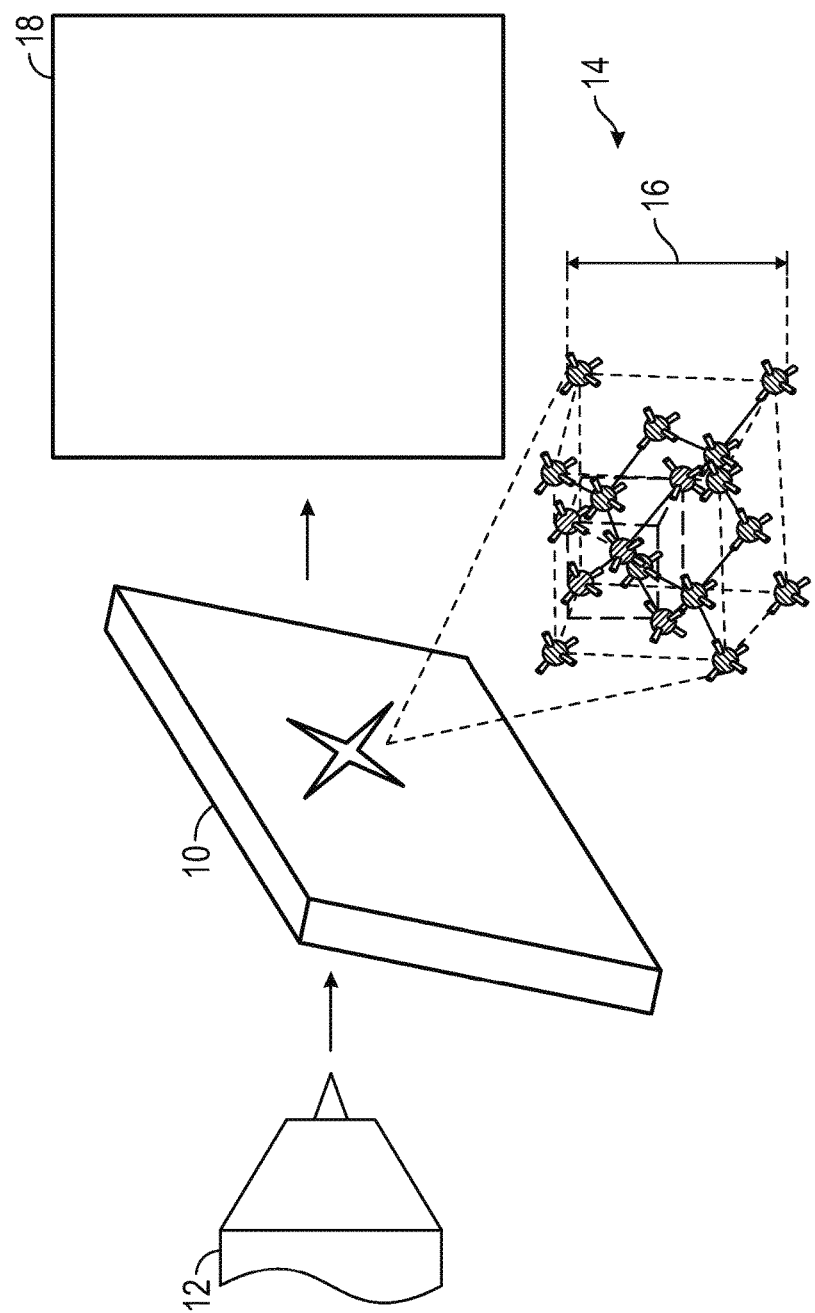
FIG. 1 illustrates directing an electron beam at a crystalline structure.

FIG. 1 illustrates a portion of a crystalline structure 10 in accordance with an exemplary embodiment. The crystalline structure 10 may be part of a semiconductor device (e.g., transistor, diode, an active region(s) of a semiconductor substrate, or the like), but the crystalline structure 10 may be part of other types of devices in alternate embodiments. In some embodiments the crystalline structure 10 includes silicon and/or germanium, where silicon and germanium typically have a diamond cubic lattice structure. The crystalline structure 10 may also include conductivity imparting impurities (dopants), as is typical in semiconductor substrates used in the semiconductor device industry. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor substrate is a silicon substrate. The silicon substrate may be a bulk silicon wafer or may be a thin layer of silicon on an insulating layer (commonly known as silicon-on-insulator or SOI) that, in turn, is supported by a carrier wafer.

The crystalline structure 10 is set up as a target of an electron beam production device 12, such as a transmission electron microscope, although other electron beam production devices 12 may be used in alternate embodiments. The electron beam production device 12 is a device that is capable of producing an electron beam. In some embodiments, the crystalline structure 10 is a lamella taken from a larger crystalline structure, and may be taken from a semiconductor device. The crystalline structure 10 includes a crystal lattice 14 with a lattice spacing constant 16. Unstrained crystalline silicon has a lattice spacing constant 16 of about 0.54 angstroms, but this lattice spacing constant 16 and/or the diamond cubic lattice structure may be altered by tensive or compressive strain. The crystalline structure 10 is part of a semiconductor device (not illustrated) in many embodiments, and the strain on the crystal lattice 14 may vary within the semiconductor device. As such, the target portion of the crystalline structure 10 may be taken from different portions of the semiconductor device, so a strain profile for the semiconductor device can be determined by measuring the strain at different locations of the crystalline structure 10 within the semiconductor device. As such, the target portion of the crystalline structure 10 may be a portion of the semiconductor device.

Figure 2:
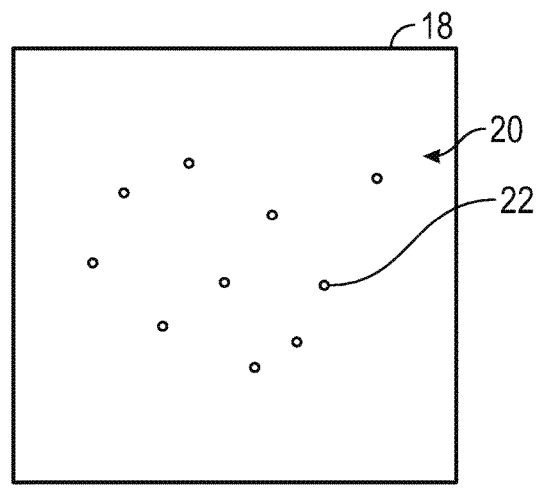
FIG. 2 illustrates a hypothetical electron diffraction pattern.
Figure 3A:
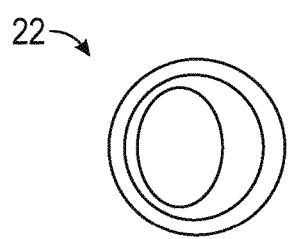
FIGS. 3A and 3B illustrate a top and side view of a graphical representation of a reflection point area, respectively.
Figure 3B:
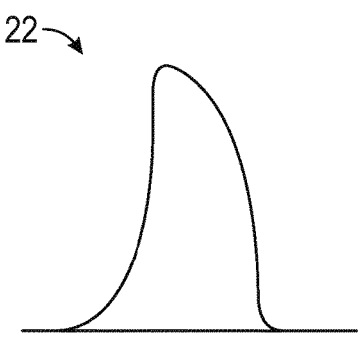

The electron beam produces an electron diffraction pattern 20 as it passes through the crystal lattice 14 of the crystalline structure 10, as illustrated in FIG. 2 with continuing reference to FIG. 1. The electron diffraction pattern 20 includes one or more reflection point areas 22. The reflection point area 22 is an area that has a higher intensity of electron impingement than other areas. The electron diffraction pattern 20 is detected by a detector 18, as explained more fully below. FIGS. 3A and 3B are charts that illustrate a top view and a side view, respectively, of the intensity distribution in a typical reflection point area 22. The center-most region includes the highest intensity, the outermost region includes the lowest intensity, and the region in between includes an intensity between that of the other two regions. As can be seen from FIG. 3A, the intensity distribution of the region with the highest intensity values within the reflection point areas 22 are generally not circular from a top view. The region with the highest intensity appears to be along one side of the reflection point area 22, and this makes it difficult to accurately determine the exact center point of the reflection point area 22.

The position of the reflection point areas 22 change as strain is induced on the crystalline structure 10. As such, the position of a particular reflection point area 22 will "move" between a non-strained crystalline structure 10 and a strained crystalline structure 10 of the same compound. The amount of strain can be determined by measuring the distance that a particular reflection point area 22 moves, or by measuring relative spatial movements of a plurality of the reflection point areas 22. However, to determine an exact distance that a reflection point area 22 moves, it is desirable to know the exact center of the reflection point area 22 to provide the most accurate position of the reflection point area 22. Therefore, the raw data set for the reflection point area 22 is refined to more accurately locate the center of the reflection point area(s) 22, as explained below.

Figure 4:
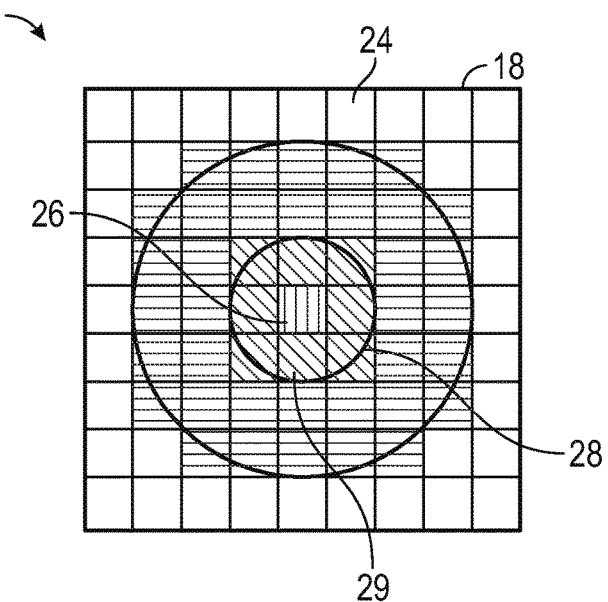
FIG. 4 illustrates a portion of a detector.
Figure 5:
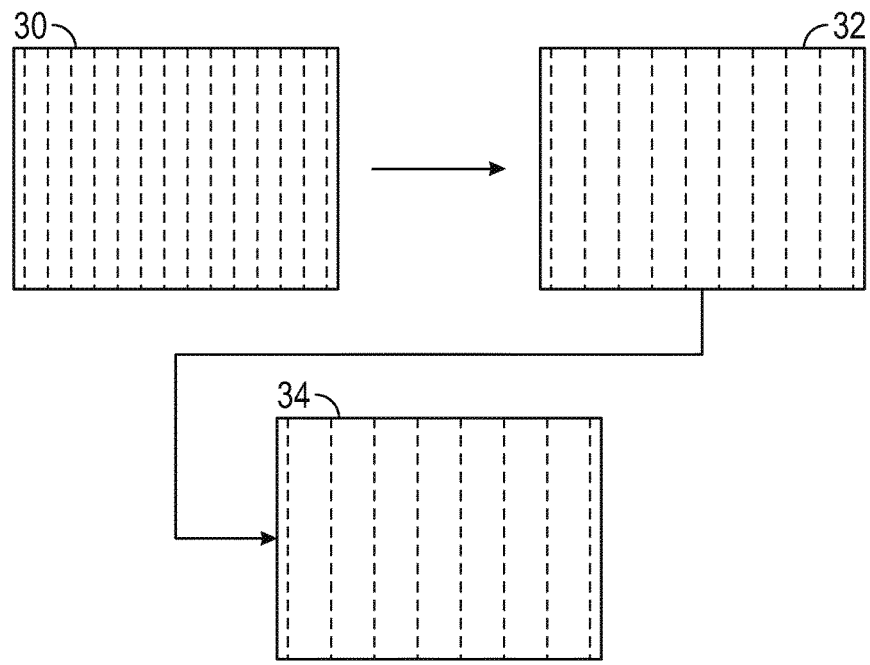
FIG. 5 illustrates a raw data set, a filtered data set, and an enhanced data set.

A portion of the detector 18 is illustrated in FIG. 4, with continuing reference to FIGS. 1 and 2, where the detector 18 includes a plurality of pixels 24. Each pixel 24 provides an intensity reading that indicates the intensity of the electron beam that strikes that pixel 24. The plurality of pixels 24 in the detector 18 form a two dimensional array for receiving the electron beam. The reflection point areas 22 have a much higher intensity of electron beam impingement than areas outside of the reflection point areas 22, as mentioned above. The intensity readings from the pixels 24 produce a raw data set 30, as illustrated in FIG. 5 with continuing reference to FIGS. 1, 2, and 4, where the dashes illustrated in FIG. 5 represent numerical values within the raw data set 30. The raw data set 30 is mathematically filtered to produce a filtered data set 32, and the contrast of the filtered data set is enhanced to produce an enhanced data set 34, as more fully described below. By processing the raw data set 30 in this manner, the center point of the reflection point area 22 can be more accurately and easily determined from the enhanced data set 34 than from the raw data set 30.

Referring back to FIG. 4, a target pixel 26 is selected from the plurality of pixels 24 for a mathematical median filtration, as mentioned above. A filter area 28 is selected about the target pixel 26, where the filter area 28 includes several other pixels 24 referred to herein as filter pixels 29. The filter area 28 can be selected in a variety of ways. In the embodiment illustrated in FIG. 4, two different possible filter areas 28 are illustrated, where the two filter areas 28 are selected with a circle having the target pixel 26 at the center. Every pixel 26 that is at least partially included within the circle is within the filter area 28 and is a filter pixel 29. Other possible techniques for selecting the filter area 28 include forming a star or other shapes that include the target pixel 26 (not illustrated.) In many embodiments, the shape is centered on the target pixel 26. The shape and dimensions used to select the filter area 28 may be predetermined, and the predetermined criteria can be used to select the filter area 28 for each target pixel 26 for the filtration process. Alternate predetermined criteria can be used for pixels 24 at the edge of the detector 18, such as eliminating the pixels 24 that would have been selected in a portion of the filter area 28 that extends beyond a detector boundary, or by replacing the pixels 24 that would have been selected in the portion of the filter area 28 that extends beyond the detector boundary with other pixels 24 within the boundary of the detector 18. Each pixel 24 in the detector can be a target pixel 26, so the entire plurality of pixels 24 in the detector 18 may be filtered, but in other embodiments the pixels 24 associated with one or more reflection point areas 22 may be selected as target pixels 26 so the filtration process is limited to a subset of the plurality of pixels 24 in the detector 18.

Figure 6:
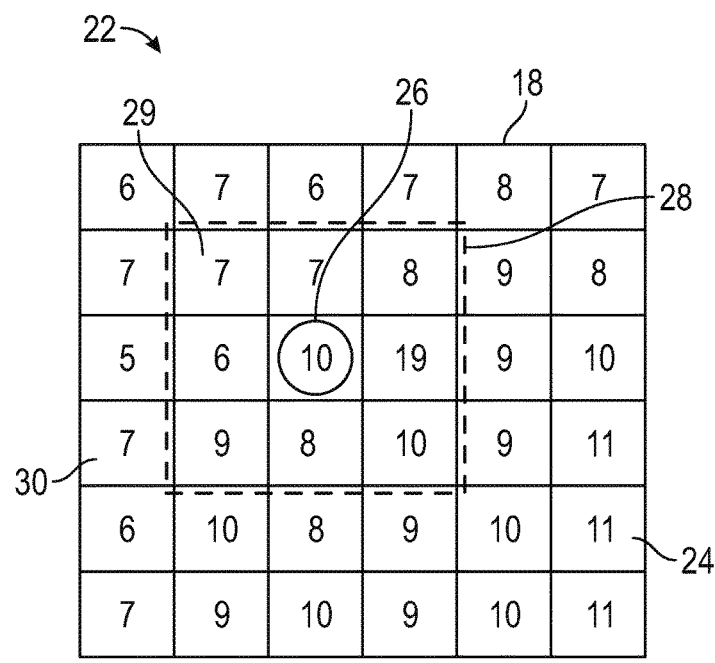
FIG. 6 illustrates a portion of a detector with pixel intensities.

One particular embodiment for selecting the filter area 28 is illustrated in FIG. 6, with continuing reference to FIGS. 1, 2, and 5. A range is selected about the target pixel 26, where the range has dimensions of N by M pixels. In the illustrated embodiment, N and M are the number "3," but N and M may be other whole numbers in alternate embodiments. In the illustrated embodiment, N and M are the same number (i.e. "3"), but in alternate embodiments N and M may not be the same number. The range is the filter area 28. In an exemplary embodiment, the values of N and M are whole numbers from about 1 to about 20, but other values may be used in alternate embodiments. Each pixel 24 illustrated in FIG. 6 includes a hypothetical intensity reading, where the target pixel 26 has a hypothetical intensity reading of "10." The intensity values for the filter pixels 29 are for illustration only, so no units are provided. These readings are hypothetical examples of numerical values for selected pixels 24 within the raw data set 30. The embodiment illustrated in FIG. 6 uses a square shape to select the filter area 28.

Figure 7:
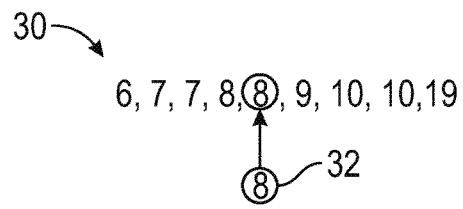
FIG. 7 illustrates pixel intensity values for filter pixels.

Reference is made to FIG. 7, with continuing reference to FIGS. 1, 2, 5 and 6. FIG. 7 illustrates the hypothetical intensity readings from the raw data set 30 for the filter pixels 29, where the intensity readings are ordered from smallest to largest. The median value of these numbers is selected and used as numerical value for the target pixel 26 within the filtered data set 32. As such, the intensity value of "10" for the target pixel 26 within the raw data set 30 is changed to the intensity value of "8" in the filtered data set 32. The median filter technique tends to eliminate outlier values, such as the illustrated pixel value of "19" from the raw data set 30. The mathematical median filter technique described above can be applied to some or all of the pixels 24 in the detector 18 in a batch manner, such as by a computer (not illustrated), so the filtered data set 32 can be produced from the raw data set 30 in a rapid manner.

Figure 8:
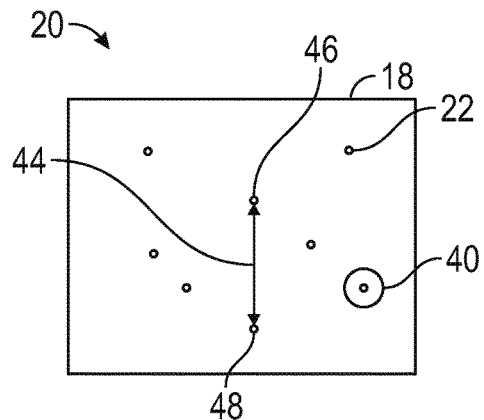
FIG. 8 illustrates another hypothetical electron diffraction pattern.

A contrast of the filtered data set 32 may be enhanced to produce the enhanced data set 34. Contrast is the rate of change of intensity readings within a region, so a rapid rate of change has a higher contrast than a gradual rate of change. A contrast area 40 is selected to include a reflection point area 22, as illustrated in FIG. 8 with continuing reference to FIGS. 1, 5 and 6. In an exemplary embodiment, the contrast area 40 is selected as a circle that includes the reflection point area 22, but the contrast area 40 may be selected as a square, rectangle, star, or other shape that includes the reflection point area 22, similar to the filter area 28 described above. In some embodiments the contrast area 40 is a circle with a diameter of from about 50 to about 250 pixels, so the shape and the dimension of the contrast area 40 may be predetermined. In an alternate embodiment, the diameter of the contrast area 40 may be from about 125 to about 175 pixels. The contrast may be enhanced by saturating the pixel intensity of a set percentage of the pixels 24 within the contrast area 40. For example, the pixel intensity of from about 2 to about 10 percent of the pixels within the contrast area 40 may be set to a maximum intensity. In alternate embodiments, the pixel intensity may be saturated for from about 3 to about 8 percent, or from about 4 to about 6 percent of the pixels 24 in the contrast area 40. The pixels 24 with the highest intensity within the contrast area 40 are selected for saturation. Therefore, in an exemplary embodiment where 5 percent of the pixels 24 are saturated and there are 1,000 pixels 24 in the contrast area 40, the intensity value of the 50 pixels 24 (50 is 5 percent of 1,000) with the highest intensity values from the filtered data set 32 are adjusted to a maximum intensity in the enhanced data set 34. As such, to be effective, the contrast area 40 and the percentage of pixels 24 that are saturated should be selected such that the value of the intensity for at least some pixels 24 are increased in the contrast enhancement process. In some embodiments, the contrast area 40 may be manually selected to include the reflection point area(s) 22, but in alternate embodiments the contrast area 40 may be automatically selected in a batch manner to include the reflection point area(s) 22, such as by a computer (not illustrated). As such, the contrast enhancement may be batch processed, and this can increase speed for the contrast enhancement.

Figure 9:
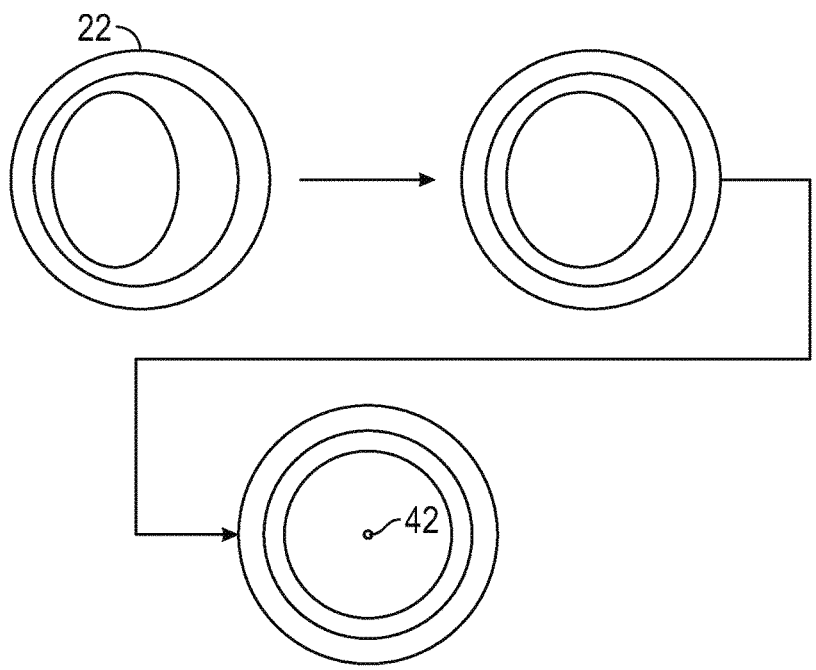
FIG. 9 illustrates a graphical top view of a reflection point area produced from a raw data set, a filtered data set, and an enhanced data set, respectively.

Contrast enhancement produces the enhanced data set 34. Experimental data shows the enhanced data set 34 generally produces a more circular region with the highest intensity values in the reflection point area 22 than is available from the filtered data set 32, and the filtered data set 32 generally produces a more circular region with the highest intensity values in the reflection point area 22 than is available from the raw data set 30, as illustrated by the hypothetical reflection point areas 22 illustrated in FIG. 9, with continuing reference to FIGS. 1, 5, 6, and 8. FIG. 9 illustrates a hypothetical reflection point area 22 produced by the raw data set 30, then a more circular region with the highest intensity values in the reflection point area 22 produced by the filtered data set 32, and finally an even more circular region with the highest intensity values in the reflection point area 22 produced by the enhanced data set 34, where the center region has the highest pixel intensity, the next region has a lower pixel intensity, and the outer region has the lowest pixel intensity. The shape changes of the different regions of the hypothetical reflection point area 22 are consistent with experimentally observed changes. The contrast may be enhanced around a reflection point area 22 to facilitate locating a center point 42 of the reflection point area 22. The center point 42 may be more easily and more accurately determined from the more circular high intensity region of the reflection point area 22 produced by the enhanced data set 34. The center point(s) 42 of the reflection point area(s) 22 may then be analyzed to determine the strain of the crystalline structure 10.

Referring back to FIG. 8, with continuing reference to FIGS. 1 and 9, a reference reflection point distance 44 may be measured, where the reference reflection point distance 44 is the distance between the center points 42 of a first selected reference point 46 and a second selected reference point 48, where the first and second selected reference points 46, 48 are predetermined reflection point areas 22 that change in a known manner based on the strain on the crystalline structure 10. The reference reflection point distance 44 may be determined for a plurality of known strain values for the crystalline structure 10 to produce a calibration curve (not illustrated), so the reference reflection point distance 44 can be compared to the calibration curve to determine the strain on the crystalline structure 10. The calibration curve may include a reference reflection point distance axes and a strain axis. The reference reflection point distance 44 may also be compared to an unstrained reference reflection point distance (not illustrated) produced from an unstrained crystalline structure 10. The unstrained reference reflection point distance may be determined by directing the electron beam at an unstrained crystalline structure 10 to produce unstrained diffraction point(s) that can be used as a baseline or reference for analysis. The strain measurement can be used in a variety of ways. For example, the measured strain may be compared to a strain specification for a certain location with a semiconductor device, and the manufacturing process can be adjusted as appropriate to keep the strain with the specification range. The strain can also be used for quality control and for other purposes.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method of evaluating a strain of a crystalline structure comprising:
    directing an electron beam at the crystalline structure to produce an electron diffraction pattern, wherein the electron diffraction pattern comprises a reflection point area;
    detecting the electron diffraction pattern with a detector comprising a plurality of pixels to produce a raw data set;
    filtering the raw data set by applying a mathematical median filter to produce a filtered data set;
    enhancing a contrast of the filtered data set to produce an enhanced data set;
    determining a center point of the reflection point area with the enhanced data set; and
    determining the strain of the crystalline structure based on analysis of the center point.

2. The method of claim 1 wherein filtering the raw data set comprises selecting a filter area for a target pixel, wherein the filter area comprises filter pixels, wherein the filter pixels comprise all of the plurality of pixels that are positioned within a range of N by M pixels about the target pixel, and wherein N and M are selected from whole numbers ranging from 1 to 20.

3. The method of claim 1 wherein enhancing the contrast of the filtered data set comprises enhancing the contrast of the filtered data set within a contrast area that includes the reflection point area to produce the enhanced data set, wherein enhancing the contrast comprises saturating a pixel intensity for a set percentage of the plurality of pixels within the contrast area, wherein the contrast area is selected to include the reflection point area.

4. The method of claim 3 wherein enhancing the contrast comprises selecting a circular contrast area.

5. The method of claim 3 wherein enhancing the contrast comprises manually selecting the contrast area to include the reflection point area.

6. The method of claim 1 wherein analyzing the center point comprises determining a reference reflection point distance between the center point of a first selected reflection point area and the center point of a second selected reflection point area.

7. The method of claim 6 wherein determining the strain of the crystalline structure comprises comparing the reference reflection point distance to a calibration curve, wherein the calibration curve comprises a reference reflection point distance axis and a strain axis.

8. The method of claim 1 wherein analyzing the center point comprises comparing a reference reflection point distance with an unstrained reflection point distance.

9. The method of claim 1 wherein directing the electron beam at the crystalline structure comprises directing the electron beam toward at least a portion of a semiconductor device, wherein the crystalline structure is part of the semiconductor device.

10. The method of claim 1 wherein directing the electron beam at the crystalline structure comprises directing the electron beam at the crystalline structure wherein the crystalline structure comprises one or more of silicon or germanium.

11. The method of claim 1 wherein filtering the raw data set comprises batch processing the raw data set.

12. The method of claim 1 wherein filtering the raw data set comprises filtering the raw data set with a computer.

13. The method of claim 1 wherein detecting the electron diffraction pattern comprises detecting the electron diffraction pattern with the detector wherein the detector forms a two dimensional array for receiving the electron beam.

14. A method of controlling a strain of a crystalline structure within a semiconductor device manufacturing process comprising:
directing an electron beam at an unstrained crystalline structure to produce an unstrained diffraction point;
directing the electron beam at the crystalline structure to produce an electron diffraction pattern, wherein the electron diffraction pattern comprises a reflection point area;
detecting the electron diffraction pattern with a detector to produce a raw data set;
mathematically filtering the raw data set to produce a filtered data set;
enhancing a contrast of the filtered data set to produce an enhanced data set;
determining a center point of the reflection point area using the enhanced data set;
comparing the center point to the unstrained diffraction point to determine the strain of the crystalline structure; and
adjusting the semiconductor device manufacturing process such that the strain of the crystalline structure is within a strain specification.

15. The method of claim 14 wherein directing the electron beam at the crystalline structure comprises directing the electron beam at the crystalline structure wherein the crystalline structure comprises one or more of silicon and germanium.

16. The method of claim 14 wherein detecting the electron diffraction pattern comprises detecting the electron diffraction pattern with the detector wherein the detector is two dimensional, and wherein the detector comprises a plurality of pixels.

17. The method of claim 16 wherein mathematically filtering the raw data set comprises selecting a filter area for a target pixel, wherein the filter area comprises filter pixels, wherein the filter pixels comprise all of the plurality of pixels that are positioned within a range of N by M pixels about the target pixel, and wherein N and M are selected from whole numbers ranging from 1 to about 20.

18. The method of claim 17 wherein mathematically filtering the raw data set comprises batch processing the raw data set for mathematical filtering the raw data set.

19. The method of claim 14 wherein enhancing the contrast of the filtered data set comprises enhancing the contrast of the filtered data set at the reflection point area to produce the enhanced data set, wherein enhancing the contrast comprises saturating a pixel intensity for a set percentage of a plurality of pixels within a contrast area, wherein the contrast area is selected to include the reflection point area.

20. A method of evaluating a strain of a crystalline structure comprising:
directing an electron beam at the crystalline structure to produce an electron diffraction pattern, wherein the electron diffraction pattern comprises a reflection point area;
detecting the electron diffraction pattern with a detector comprising a plurality of pixels to produce a raw data set, wherein the raw data set comprises a pixel intensity for each of the plurality of pixels;
filtering the raw data set by applying a mathematical median filter to produce a filtered data set, wherein filtering the raw data set comprises selecting a median pixel intensity for a range of pixels centered on a target pixel, and recording the median pixel intensity in the filtered data set as the pixel intensity for the target pixel;
enhancing a contrast of the filtered data set at the reflection point area to produce an enhanced data set, wherein enhancing the contrast comprises saturating the pixel intensity for a set percentage of the plurality of pixels within a contrast area, wherein the contrast area is selected to include the reflection point area;
determining a center point of the reflection point area using the enhanced data set; and
analyzing the center point to determine the strain of the crystalline structure.

* * * * *